(12) United States Patent
Cha et al.

(10) Patent No.: US 6,348,385 B1
(45) Date of Patent: Feb. 19, 2002

(54) METHOD FOR A SHORT CHANNEL CMOS TRANSISTOR WITH SMALL OVERLAY CAPACITANCE USING IN-SITU DOPED SPACERS WITH A LOW DIELECTRIC CONSTANT

(75) Inventors: Randall Cher Liang Cha; Tae Jong Lee; Alex See, all of Singapore (SG); Lap Chan, San Francisco, CA (US); Chee Tee Chua, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/726,256

(22) Filed: Nov. 30, 2000

(51) Int. Cl.[7] ............................................. H01L 21/336
(52) U.S. Cl. ........................ 438/287; 438/563; 438/591
(58) Field of Search ................................. 438/183, 216, 438/287, 558, 563, 591, 595

(56) References Cited

U.S. PATENT DOCUMENTS

| 5,447,874 A | 9/1995 | Grivna et al. ................. 437/40 |
| 5,966,597 A | 10/1999 | Wright ........................ 438/197 |
| 6,033,963 A | 3/2000 | Huang et al. ................ 438/303 |
| 6,087,208 A | 7/2000 | Krivokapic et al. ......... 438/183 |
| 6,087,231 A | 7/2000 | Xiang et al. ................. 438/287 |
| 6,204,133 B1 * | 3/2001 | Yu et al. ...................... 438/595 |
| 6,238,985 B1 * | 5/2001 | Yoon ........................... 438/287 |

FOREIGN PATENT DOCUMENTS

JP 60-38876 * 2/1985

* cited by examiner

*Primary Examiner*—Chandra Chaudhari
(74) *Attorney, Agent, or Firm*—George O. Saile; Rosenmary L. S. Pike; William J. Stoffel

(57) ABSTRACT

The method for a transistor using a replacement gate process that has a doped low-K dielectric spacer that lowers the junction capacitance. A dummy gate is formed over a substrate. Ions are implanted into the substrate using the dummy gate as an implant mask to form source and drain regions. A masking layer is formed on the substrate over the source and drain regions. We remove the dummy gate. Doped low k spacers are formed on the sidewalls of the masking layer. The doped spacers are heated to diffuse dopant into the substrate to form lightly doped drain (LDD regions). We form a high k gate dielectric layer over the masking layer. A gate layer is formed over the high K dielectric layer. The gate layer is chemical-mechanical polished (CMP) to form a gate over the high k dielectric layer and to remove the gate layer over the masking layer.

12 Claims, 3 Drawing Sheets

METHOD FOR A SHORT CHANNEL CMOS TRANSISTOR WITH SMALL OVERLAY CAPACITANCE USING IN-SITU DOPED SPACERS WITH A LOW DIELECTRIC CONSTANT

BACKGROUND OF INVENTION

1) Field of the Invention

This invention relates generally to fabrication of semiconductor devices and more particularly to the fabrication of a MOS transistor using a replacement gate process and where the transistor has low and high·K gate dielectric layers.

2) Description of the Prior Art

Increasing precision in device manufacturing is required because of the constantly increasing density of semiconductor devices in integrated circuit manufacturing. The ability to control the gate length in field effect transistors (FETs) is of importance. Without the ability to shorten gate length, an increase in density and circuit performance could not be accomplished. Also, because of the reduced gate lengths, there is a need for an improved process that reduces the junction capacitance between the source/drain extension lateral overlap and the gate.

Present gate manufacturing methods result in nonuniform gate length, circuit damage from reactive ion etch (RIE) of the gate lines, and/or require additional processing steps. For example, a substitutional gate method (e.g., replacement gate method) of producing FET gates uses an oxide plug that is created using an anisotropic etch. The oxide plug is then coated with polymer and its surface is planarized. The plug is then removed and substituted by gate metal through lift-off techniques. There are several disadvantages in using the oxide plug method. First, it requires a large increase in photo and process steps. Second, spacers cannot be used in an oxide plug method to reduce gate size. Third, the lift-off technique severely limits the size and thickness of the gate metal line making the process virtually impossible for sub micron gate lengths.

Another method again uses an anisotropic dielectric etch process to control gate length by etching an opening instead of a plug. A dielectric is deposited then the gate opening is anisotropically RIE etched down to the substrate to define gate dimensions. The opening is filled with the gate material and the top surface of the gate line is then patterned with photoresist and etched. Again there are several disadvantages to this method. Since the gate is patterned and etched leaving full thickness on top of the remaining oxide, the planarity of the device is lost, requiring additional dielectric planarization techniques prior to routing interconnect metallization. In addition, spacer technology cannot be used. Without spacer technology, it is difficult to optimize for high device performance without introducing drain induced barrier lowering or device breakdown control problems. This limits the performance and scalability of the device.

A third method for controlling gate length would be a low pressure, high plasma density, RIE etch tool which typically etches material in the five to ten millitorr range. Under these conditions, an anisotropic etch of the gate material can be obtained. Again there are several disadvantages to this method. Damage and contamination from the gate material deposition and etch process can degrade device performance by creating surface states or destroying the crystal structure of the semiconductor. Also, the gate dimension cannot be reduced below the capability of the photoresist alignment tool since sidewall spacers cannot be used to shrink the gate opening beyond its resolution capability.

Because of the reduced gate lengths, there is a need for an improved process that reduces the junction capacitance between the source/drain extension lateral overlap and the gate.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,087,208 (Krivokapic et al.) recites a replacement gate process.

U.S. Pat. No. 6,087,231 (Xiang et al.) shows a replacement gate process with a high-k gate dielectric.

U.S. Pat. No. 6,033,963 (Huang) teaches another replacement gate process.

U.S. Pat. No. 5,447,874 (Grivna) and U.S. Pat. No. 5,966,597 (Wright) show replacement gate processes.

SUMMARY OF THE INVENTION

It is an object of the present invention to provide a method for fabricating a MOS transistor using a replacement gate process.

It is an object of the present invention to provide a method for fabricating a field effect transistor (FET) having composite or parallel low and high K gate dielectric layers.

It is an object of the present invention to provide a method for fabricating a field effect transistor (FET) having reduced overlay junction capacitance and form gate dielectric layers containing both low and high K dielectric materials.

It is an object of the present invention to provide a method for fabricating a field effect transistor (FET) having an improved process that reduces the junction capacitance between the source/drain extension lateral overlap and the gate.

To accomplish the above objectives, the present invention provides a method of manufacturing a MOS transistor with an improved junction capacitance. Important elements of the invention are the doped low-k spacers and the high K gate dielectric layer. The low-k spacers and the high K gate dielectric form a portion of the gate dielectric that assist in reducing the junction capacitance between the source/drain extension lateral overlap and the gate.

The invention's method of fabrication of a transistor comprises following the steps. A dummy gate is formed over a substrate. Ions are implanted into the substrate using the dummy gate as an implant mask to form source and drain regions. A masking layer is formed on the substrate over the source and drain regions and not over the dummy gate. We remove the dummy gate. In a key step, doped low-k spacers are formed an the sidewalls of the masking layer. The doped spacers are heated to diffuse dopant into the substrate to form lightly doped drain (LDD regions). We form a high k (gate) dielectric layer over the masking layer. A gate layer is formed over the high K dielectric layer. The gate layer is chemical-mechanical polishing (CMP) to form a gate over the high k dielectric layer and to remove the gate layer over the masking layer.

The invention's combination of the low-K spacer and the high K gate dielectric layer reduce junction capacitance between the source/drain extension lateral overlap and the gate because the low k spacer overlies the S/D extension (e.g., LDD). The low k spacer has a lower dielectric constant and thus RC is lowered because Capacitance is lowered. This is important and a benefit because the device has faster signal propagation and larger drive current.

In addition, the invention has the following unique features and benefits:
- no spacers surrounding the dummy gate
- only a S/D implant—no diffused S/D region
- LDD formed from the out diffusion form the doped spacers
- a gate dielectric formed from low K and high K materials thus reducing the junction capacitance
- tapered gate owing to low-K spacers thus giving a shorter channel length.
- The gate channel length can be controlled by changing the size of the doped low-k spacers by changing the anisotropic etch time and anneal time.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a replacement gate using a doped low K spacer 32 and a high K gate dielectric layer 36. The invention reduces junction capacitance between the LDD (e.g., S/D extensions) and the gate 42. (See FIG. 7).

In this patent, a "low k" material means a material with a dielectric constant below 3.0 (e.g., preferably about 1.8 to 2.2) and a "high k" material means a material with a dielectric constant of 3.0 or higher and more preferably of greater than 5.0.

In the example of the preferred embodiment, a NMOS device is described, but PMOS and a combination of NMOS and PMOS can be fabricated as well using the invention's process.

A. Dummy gate

Figure 1:
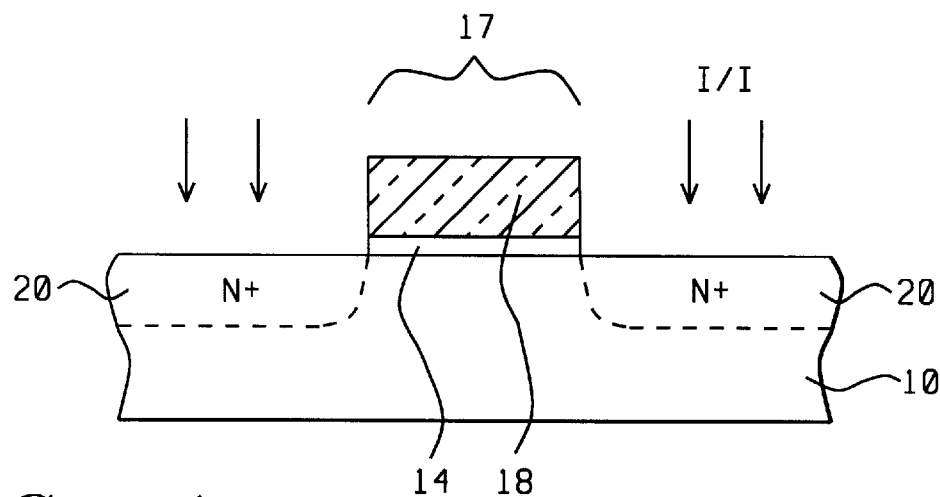
FIGS. 1 through 7 are cross sectional views for illustrating a method for manufacturing a FET according to the present invention.

Referring to FIG. 1, a pad dielectric layer 14 and an insulating layer 18 are over a substrate 10. The pad dielectric layer 14 and insulating layer 18 are patterned to form a dummy gate 14 18 and openings where source and drain regions will be formed. The dummy gate includes both layers 14 and 18. The dummy gate 14 18 covers a first region 17 in the substrate 10 where light doped drains (LDD) and a gate will be formed. That is the dummy gate 14 18 covers a first region 17 where LDD are formed and a channel region under a gate is located between the LDDs. The dummy gate preferably has a width between 0.15 μm and 0.25 μm.

B. S/D

As shown in FIG. 1, ions are implanted to form source and drain regions 20. This is an important step. The to inventor's have found that it is critical to use an ion implant process and not a diffusion process to form the LDDs since the implant process and subsequent thermal processes activate more dopant thus improving FET performance.

C. Silicide regions

Figure 2:
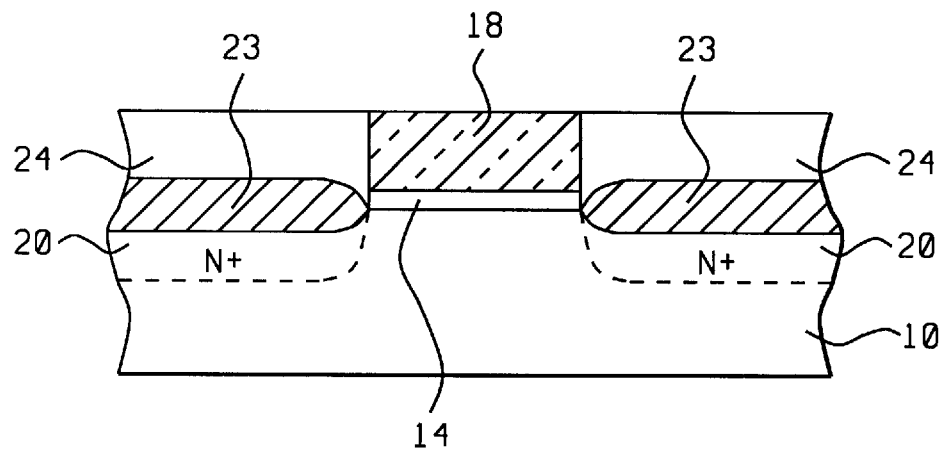

As shown in FIG. 2, silicide regions 23 are formed over the S/D regions 20. The silicide regions are self-aligned because no silicide forms over the dummy gate 14 18.

D. masking layer

As shown in FIG. 2, we form a masking layer 24 on the substrate over the silicide and source and drain regions. The masking layer is preferably formed by depositing a dielectric layer over the substrate and the insulating layer 18. Then we chemical-mechanical polish (CMP) the masking layer to remove the masking layer from over the dummy gate 14 18.

Figure 3:
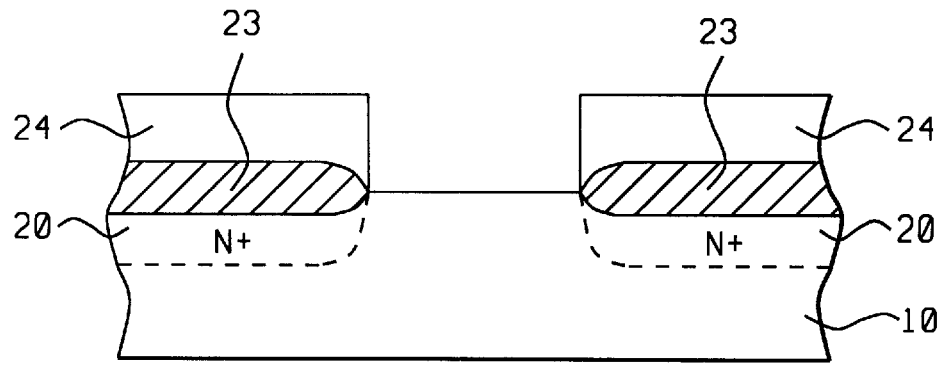

Referring to FIG. 3, we removing the dummy gate 14 18. The dummy gate structure 14 18 (e.g., insulating layer 18 and the pad dielectric layer 14) is preferably removed using a selective etch.

E. Spacers

Figure 4:
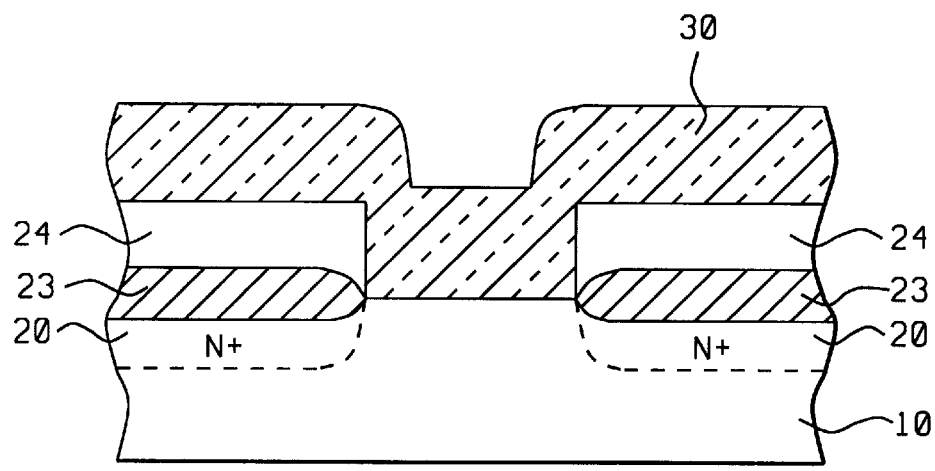

As show in FIG. 4, a doped dielectric layer 30 is deposited over the masking layer 24 and the substrate 10 in the channel region. The doped dielectric layer 30 is preferably comprised of a in situ $POCl_3$ doped low K silicon oxide material and the doped dielectric layer 30 has a thickness of between about 3000 and 5000 Å. The doped dielectric layer 30 preferably has a dopant concentration between 5E15 and 5E16 atoms/cm$^2$.

Note that doped dielectric layer is not doped by an ion implant process. The invention's insitu doped dielectric layer has a high doping concentration level than dielectric layers that are doped by an I/I process after the dielectric layer is deposited. The in situ $POCl_3$ doped low K silicon oxide material is doped as it is formed and deposited, not doped after it is deposited.

Figure 5:
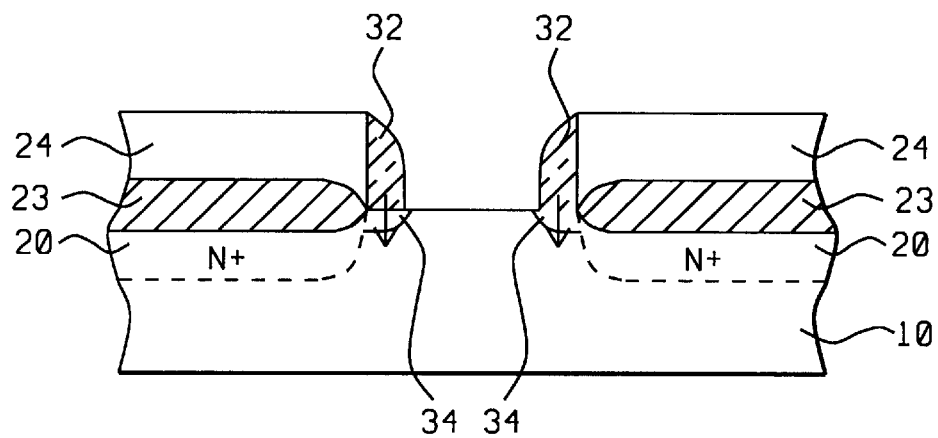

As shown in FIG. 5, we anisotropically etch the doped dielectric layer 30 to form doped spacers 32 on the sidewalls of the masking layer 24. The spacers preferably have a width of between about 0.01 and 0.03 μm

F. LDD

Next, we heat the doped spacers to diffuse dopant into the substrate 10 to form lightly doped drain (LDD regions) 34. The lightly doped drain (LDD) regions are formed by heating the doped spacers to a temperature in the range of between 800° C. and 1000° C. for a time between 5 and 15 minutes. The LDD 34 preferably have a concentration between 5E13 and 5E14 atoms/Cm$^2$ and a width between 0.01 μm and 0.03 μm and a maximum depth between 300 and 400 Å.

The heat treatment is preferably a low Temperature heat treatment so not to affect the silicide properties.

Also, the channel length can be controlled by the spacer 32 size (width) (e.g., thickness or etch duration) and heat temperature and time.

G. High K layer 36

Figure 6:
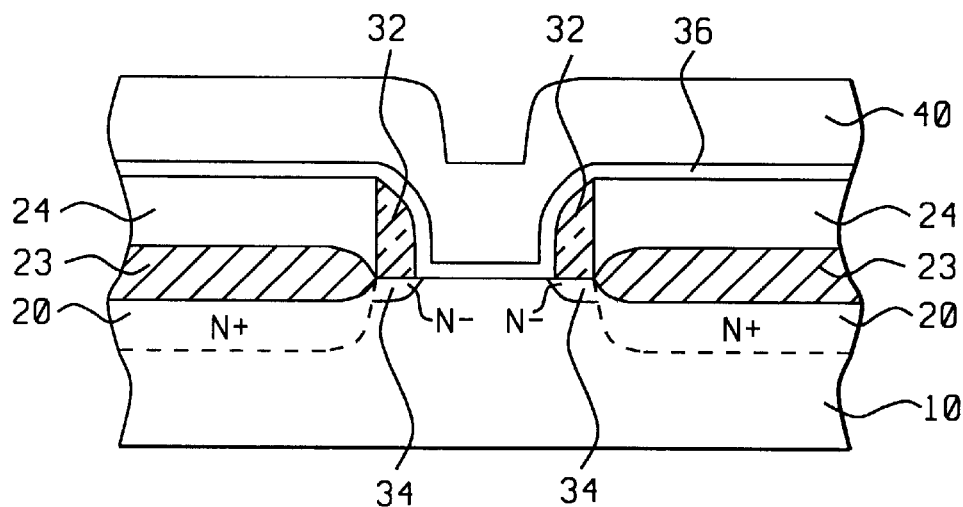

As shown in FIG. 6, we form a high k dielectric layer 36 over the masking layer 24. The high k dielectric layer 36 has a thickness of between about 100 and 300 Å. The high k dielectric layer 36 is comprised of nitride, transitional oxides, (e.g., Tantalium pentoxide, HfO2, etc.) and has a K greater than 3.0 and more preferably greater than 5.

H. Gate

As shown in FIG. 6, we form a gate layer 40 over the high K dielectric layer 36. The gate layer 40 is comprised of metals (e.g., W, Ti etc) or doped polysilicon.

The gate is preferably a metal gate comprised of W, Ti, Ta, Ni or Cr.

Figure 7:
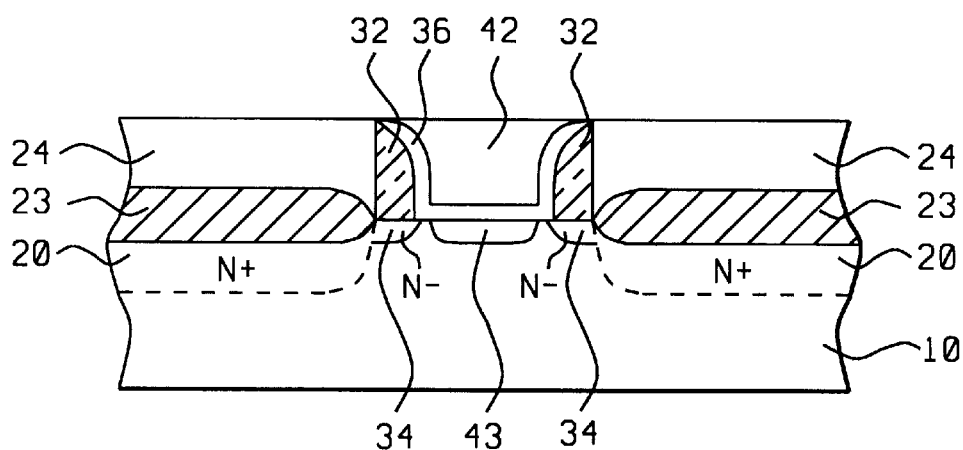

As shown in FIG. 7, we preferably chemical-mechanical polishing (CMP) the gate layer 40 to form a gate over the high k dielectric layer 36 and to remove the gate layer 40 over the masking layer 24. The gate between has a width 43 over the channel (e.g., over the high k 36, but not over the spacer 32) between 0.12 and 0.28 µm.

I. Benefits

The invention's combination of the low-K spacer 32 and the high K gate dielectric layer 36 (see FIG. 7) reduce junction capacitance because the low k spacer overlies the S/D extensions 34. In addition, the invention has the following unique features and benefits:

no spacers surrounding the dummy gate only a S/D implant—no diffused S/D region low-K insitu doped spacer intruding into the gate opening LDD formed form the out diffusion form the doped spacers a gate dielectric formed form low K and high K materials tapered gate owing to low-K spacers thus yielding a shorter channel length.

Self-aligned LDD to the low k spacer.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

In the above description numerous specific details are set forth such as flow rate s, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate different sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Unless explicitly stated otherwise, each numerical value and range should be interpreted as being approximate as if the word about or approximately preceded the value of the value or range. About means a range plus or minus 10% of the given value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a transistor using a replacement gate process and low k doped spacers; comprising the steps of:

a) forming a dummy gate over a substrate;

b) ion implanting ions using said dummy gate as an implant mask to form source and drain regions;

c) forming a masking layer on said substrate over said source and drain regions;

d) removing said dummy gate;

e) forming doped spacers on the sidewalls of said masking layer; said doped spacers have a dielectric constant of less than 3.0;

f) heating said doped spacers to diffuse dopant into said substrate to form lightly doped drain regions;

g) forming a high k dielectric layer over said masking layer and said doped spacers;

h) forming a gate layer over said high K dielectric layer; and i) chemical-mechanical polishing (CMP) said gate layer to form a gate over said high k dielectric layer and to remove the gate layer over the masking layer.

2. The method of claim 1 which further includes after step (b) but before step (c): forming silicide regions over said source and drain regions.

3. The method of claim 1 wherein said dummy gate is formed by:

forming a pad dielectric layer and an insulating layer over a substrate;

patterning said pad dielectric layer and insulating layer to form a dummy gate and to form openings where source and drain regions will be formed; said pad dielectric layer and insulating layer cover a first region in said substrate where lightly doped drain regions and a gate will be formed.

4. The method of claim 1 wherein said masking layer is formed by depositing a dielectric layer over said substrate and said insulating layer and chemical-mechanical polishing said masking layer to remove the masking layer over the insulating layer.

5. The method of claim 1 wherein said dummy gate is removed using a selective etch.

6. The method of claim 1 wherein said doped spacers are formed by:

depositing a doped dielectric layer over said masking layer and said substrate in said channel region; said doped dielectric layer comprised of a POCl$_3$ doped low K silicon oxide material and said doped dielectric layer has a thickness of between about 3000 and 5000 Å;

anisotropically etching said doped dielectric layer to form doped spacers on the sidewalls of said masking layer.

7. The method of claim 1, wherein said lightly doped drain regions are formed by heating the doped spacers to a temperature in the range of between 800 and 1000° C. for a time between 5 and 15 minutes.

8. The method of claim 1 wherein said high k dielectric layer has a thickness of between about 100 and 300 Å.

9. The method of claim 1 wherein said high k dielectric layer is comprised of transition oxides and has a K greater than 5.

10. The method of claim 1 wherein said gate layer is comprised of a metal or a doped polysilicon.

11. The method of claim 1 wherein said gate has a width closest to the surface of said substrate of between about 0.12 and 0.28 µm.

12. A method of fabrication of a transistor using a replacement gate process and low k doped spacers; comprising the steps of:
- a) forming a pad dielectric layer and an insulating layer over a substrate;
- b) patterning said pad dielectric layer and insulating layer to form a dummy gate and to form openings where source and drain regions will be formed; said pad dielectric layer and insulating layer cover a first region in said substrate where lightly doped drain regions and a gate will be formed;
- c) ion implanting ions using said dummy gate as a block to form source and drain regions;
- d) forming silicide regions over said source and drain regions;
- e) forming a masking layer on said substrate over said source and drain regions;
  - (1) said masking layer is formed by depositing a dielectric layer over said substrate and said insulating layer and chemical-mechanical polishing (CMP) said masking layer to remove the masking layer over the insulating layer;
- f) removing said dummy gate;
  - (1) dummy gate is removed using a selective etch;
- g) depositing a doped dielectric layer over said masking layer and said substrate;
  - (1) said doped dielectric layer comprised of a $POCl_3$ doped low K silicon oxide material and said doped dielectric layer has a thickness of between about 3000 and 5000 Å;
- h) anisotropically etching said doped dielectric layer to form doped spacers on the sidewalls of said masking layer;
- i) heating said doped spacers to diffuse dopant into said substrate to form said lightly doped drain regions;
- j) forming a high k dielectric layer over said masking layer and said doped spacers;
  - (1) said high k dielectric layer has a thickness of between about 100 and 300 Å;
  - (2) said high k dielectric layer is comprised of a transition oxide and has a K greater than 5;
- k) forming a gate layer over said high K dielectric layer;
  - (1) said gate layer is comprised of a metal or polysilicon;
- l) chemical-mechanical polishing (CMP) said gate layer to form a gate over said high k dielectric layer and to remove the gate layer over the masking layer.

* * * * *